(12) United States Patent
Champion et al.

(10) Patent No.: US 7,706,903 B2
(45) Date of Patent: Apr. 27, 2010

(54) SELECTIVE MUTING OF APPLICATIONS

(75) Inventors: David Frederick Champion, Durham, NC (US); Vincent Rocco Lanzolla, Clayton, NC (US); Timothy Andreas Meserth, Durham, NC (US); Mark E. Molander, Cary, NC (US); David Thomas Windell, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 967 days.

(21) Appl. No.: 11/403,442

(22) Filed: Apr. 13, 2006

(65) Prior Publication Data

US 2007/0244586 A1    Oct. 18, 2007

(51) Int. Cl.
    *G06F 17/00* (2006.01)
(52) U.S. Cl. .................. 700/94; 715/716
(58) Field of Classification Search .......... 700/94
    See application file for complete search history.

(56) References Cited

U.S. PATENT DOCUMENTS

| | | | | |
|---|---|---|---|---|
| 4,292,467 | A | | 9/1981 | Odlen et al. ........... 179/1 D |
| 5,402,499 | A | | 3/1995 | Robison et al. ......... 381/119 |
| 5,703,794 | A | * | 12/1997 | Heddle et al. .......... 700/94 |
| 5,768,126 | A | | 6/1998 | Frederick ............. 700/94 |
| 5,969,719 | A | | 10/1999 | Tsujimoto ............ 345/349 |
| 5,974,383 | A | | 10/1999 | Fado et al. ........... 704/270 |
| 6,009,519 | A | | 12/1999 | Jones et al. .......... 713/1 |
| 6,031,529 | A | | 2/2000 | Migos et al. .......... 345/340 |
| 6,078,942 | A | * | 6/2000 | Eisler et al. .......... 718/100 |
| 6,093,880 | A | * | 7/2000 | Arnalds .............. 84/464 R |
| 6,212,541 | B1 | | 4/2001 | McAuliffe et al. ....... 718/100 |
| 6,405,255 | B1 | | 6/2002 | Stoltz et al. .......... 709/231 |
| 6,996,445 | B1 | | 2/2005 | Kamijo .............. 700/94 |
| 6,905,414 | B2 | | 6/2005 | Danieli et al. ......... 463/42 |
| 7,142,678 | B2 | | 11/2006 | Falcon .............. 381/107 |
| 7,213,054 | B2 | | 5/2007 | Evans et al .......... 709/213 |
| 7,216,221 | B2 | | 5/2007 | Bear et al. ........... 713/1 |
| 7,225,314 | B1 | * | 5/2007 | Bonwick et al. ........ 711/170 |
| 2001/0018738 | A1 | | 8/2001 | Mori et al. ........... 713/100 |

(Continued)

OTHER PUBLICATIONS

"Learning about Audio in Windows Vista", Steve Ball, http://channel9.msdn.com/showpost.aspx?postid=116347, Mar. 17, 2006, 17 pages.

(Continued)

*Primary Examiner*—Curtis Kuntz
*Assistant Examiner*—Paul McCord
(74) *Attorney, Agent, or Firm*—Harrington & Smith

(57) ABSTRACT

Methods, computer program products, and electronic devices are provided for managing sound in a plurality of computer-executed applications. One method includes: operating a sound manager function to provide a user with an option to selectively mute up to n-1 applications of n applications, where n>1; and in response to the user choosing to selectively mute up to n-1 applications, the sound manager function selectively muting the up to n-1 applications. Another method includes providing a user with an option to selectively mute up to n-1 applications of n applications, where n>1. In response to the user choosing to selectively mute up to n-1 applications, at least one action is performed in response to requests to play sounds by the selectively muted applications so that the sounds are muted with respect to a sound device.

20 Claims, 11 Drawing Sheets

U.S. PATENT DOCUMENTS

| | | | | |
|---|---|---|---|---|
| 2002/0032753 | A1* | 3/2002 | Stoltz et al. | 709/219 |
| 2002/0122363 | A1* | 9/2002 | Skotnicki | 369/47.12 |
| 2002/0169603 | A1* | 11/2002 | Sculley | 704/229 |
| 2003/0035527 | A1 | 2/2003 | Baker | 379/207.01 |
| 2004/0030599 | A1* | 2/2004 | Sie et al. | 705/14 |
| 2004/0031856 | A1 | 2/2004 | Atsmon et al. | 235/492 |
| 2004/0064210 | A1 | 4/2004 | Puryear et al. | 700/94 |
| 2004/0066414 | A1 | 4/2004 | Czerwinski et al. | 345/781 |
| 2004/0102861 | A1 | 5/2004 | Han | 700/94 |
| 2004/0174901 | A1 | 9/2004 | Ghori et al. | 370/466 |
| 2004/0212640 | A1 | 10/2004 | Mann et al. | 345/792 |
| 2005/0043831 | A1 | 2/2005 | Baudisch | 700/94 |
| 2006/0168114 | A1 | 7/2006 | Glatron et al. | 709/218 |
| 2006/0210097 | A1* | 9/2006 | Yerrace et al. | 381/119 |
| 2006/0285701 | A1 | 12/2006 | Chumbley et al. | 381/104 |
| 2008/0139190 | A1* | 6/2008 | Bunte et al. | 455/418 |

OTHER PUBLICATIONS

"Why We Need Per-Application Sound Control", http://caseyporn.com/blog/archives/000362.html, Jun. 25, 2007, XP007902558 (4 pp.).

http://web.archive.org/web/2004122914325/rogueameoba.com/detour/, Jun. 25, 2007, XP007902559 (2 pp.).

http://webarchive.org/web/20060408140239/http://indievolume.com/, June. 25, 2007, XP007902560 (3 pp.).

* cited by examiner

SELECTIVE MUTING OF APPLICATIONS

TECHNICAL FIELD

The exemplary embodiments of this invention relate generally to computer applications and, more specifically, relate to sound management for computer applications.

BACKGROUND OF THE INVENTION

Many computer applications have their own sound effects. For instance, an instant messaging application might use a special tone played when a new message comes in. Similarly, an electronic mail application could use a different tone to signal received mail. As electronic devices such as computers become more integrated in the home, additional sounds might be used. Illustratively, many home users now use Voice Over Internet Protocol (VOIP), which provides phone capabilities. Some of those phone capabilities include ring tones, which are also prevalent on electronic devices like cellular phones.

A simple exemplary way for a computer application to play a sound is sending a message to an Application Programmer Interface (API) as part of an Operating System (OS). For instance, the message might be "play (RingTone.wav)", where the RingTone.wav is a "wave" file stored in a particular location (omitted for clarity) on the electronic device. The RingTone.wav is a file of information having sound from a ring tone the user selects as a tone used by the VOIP application. The "play (.)" is a function supported by the API.

The API is a part of the OS and in this example the play (.) function performs all necessary operations so that the ring tone is coupled to an Audio/Video (A/V) component, such as a sound card, to be played on a sound device such as a speaker. Generally, an A/V component has a number of MultiMedia (MM) devices. For instance, a wavetable synthesizer might be used to play information from the RingTone.wav file. In general, one or more drivers are intermediate the API and the A/V component, and the drivers are typically installed into and become part of the OS. The drivers are designed to interface with the OS and to operate, at a low level, the MM devices on the A/V component. The API function, play (.), fetches data from the wave file at appropriate times, possibly fills buffers, and ensures the wave file is doled out to the driver(s) at the correct times. The play (.) function can in this example also message the application when the wave is done playing. Thus, the operating system of an electronic device provides techniques useful for playing sounds.

Electronic devices such as computer systems also provide some modicum of control over sounds played by applications. For instance, conventional Operating Systems ("OSs" or "OS" in the singular) usually provide a volume control with an option to mute all sounds. Unfortunately, this type of volume control is lacking in certain respects. Therefore, it would beneficial to provide users with increased control over sounds on electronic devices such as computers.

SUMMARY

In an exemplary embodiment, a computer program product is disclosed for managing sound for n computer-executed applications. The computer program product includes program instructions embodied on a tangible computer-readable medium. Execution of the program instructions result in operations including allowing a user to selectively mute up to n-1 applications of the n applications, where n>1. The operations also include, in response to the user choosing to selectively mute up to n-1 applications, performing at least one action in response to requests by the selectively muted applications to play sounds so that the sounds are muted with respect to a sound device.

In another exemplary embodiment, the operation of performing at least one action further includes an operation of muting for a respective one of the requests from a corresponding one of the applications at least one multimedia device coupled to the corresponding application and to the sound device.

In a further exemplary embodiment, the operation of performing at least one action further including an operation of rejecting a respective one of the requests from a corresponding one of the applications.

In another exemplary embodiment, for a respective one of the requests from a corresponding one of the applications, the operation of performing at least one action further includes operations of responding to the corresponding application for any response associated with the respective request and ensuring that data corresponding to the sound is not coupled to the sound device.

In yet another exemplary embodiment, a respective one of the requests from a corresponding one of the applications references data corresponding to the sound. Also, the operation of performing at least one action further includes operations of muting the data prior to coupling the data to the sound device and coupling the muted data to the sound device.

As another example, the operation of muting the data further includes an operation of performing one of zeroing data corresponding to the sound or decreasing to a predetermined value a level of the data. Additionally, the operation of coupling the muted data to the sound device further includes the operation of passing a function call, including a reference to the muted data, to an operating system.

In another exemplary embodiment, a respective one of the requests from a corresponding one of the applications references first data corresponding to the sound. Also, the operation of performing at least one action further includes an operation of coupling second data to the sound device, the second data comprising a muted version of the first data. The second data may be created through an operation of performing one of zeroing the first data to create the second data or decreasing to a predetermined value a level of the first data to create the second data. The operation of coupling the second data to the sound device can further include an operation of passing a function call, including a reference to the second data, to an operating system. The muted version of the first data can include one of first data that has been zeroed or first data that has had a level of the first data decreased to a predetermined value.

In another exemplary embodiment, a respective one of the requests includes a request to play a sound stored at least partially in at least one file.

In yet another exemplary embodiment, the operation of performing at least one action further comprises an operation of performing one of zeroing data corresponding to the sound or decreasing to a predetermined value a level of the data. Also, the operation of decreasing to a predetermined value a level of the data can further include the operation of mapping each first value for samples of the data to a second value, wherein a range of the second values is less than a range of the first values.

In another exemplary embodiment, data corresponding to the sound is stored in a file, and the operation of performing at least one action further includes retrieving the data from the first file, muting the data, and storing the data in a second file.

In another embodiment, an electronic device is disclosed that includes one or more memories including a function having a set of processor-readable instructions. The electronic device includes one or more one data processors coupled to the one or more memories, where the one or more data processors are configured to execute the function. The electronic device further includes a display coupled to the one or more data processors and an input device coupled to the one or more data processors. The function when executed on the one or more processors configures the one or more data processors to provide on the display a dialog allowing a user to selectively mute individual ones of a plurality of applications. In response to the user using the input device to select through at least one interaction with the dialog at least one application to be muted, indicia is placed on the dialog indicating the selected at least one application is muted.

BRIEF DESCRIPTION OF THE DRAWINGS

The foregoing and other aspects of embodiments of this invention are made more evident in the following Detailed Description, when read in conjunction with the attached figures, wherein.

DETAILED DESCRIPTION

Before proceeding with exemplary embodiments, it is beneficial to describe in further detail problems with conventional electronic devices. In the examples that follow, portions of a conventional OS on an electronic device of a computer system will be described, then problems with the conventional OS will be described.

Figure 1:
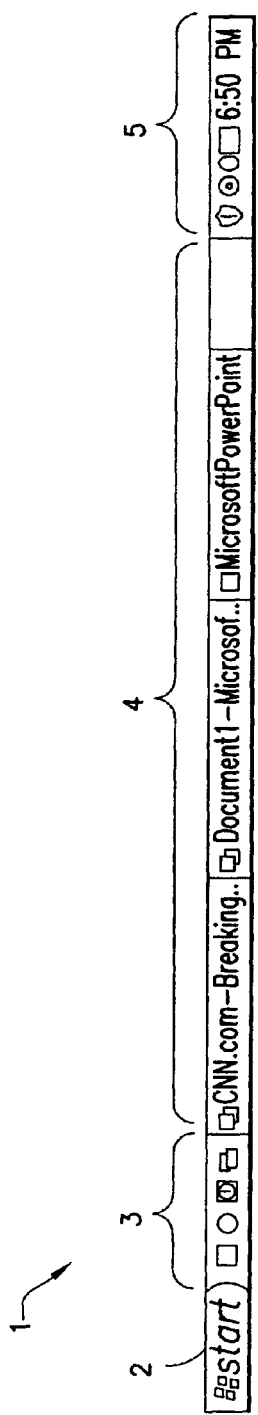
FIG. 1 depicts a taskbar of a Windows XP operating system.

FIG. 1 shows a taskbar 1 of a Windows XP operating system. The taskbar 1 comprises four sections: a start menu button 2, a quick launch bar 3, a programs region 4, and a systray 5. The start menu button 2, when left-clicked, opens the start menu for a user. The quick launch bar 3 enables a user to launch applications by left-clicking on the appropriate icon in the quick launch bar 3. The applications region 4 comprises buttons showing which, if any, applications are currently running. The systray 5 displays small icons enabling a user to know what is currently loaded in the computer's memory. These icons may include an icon for a system volume dialogue. The systray may also show the current time, day, and/or date.

Figure 2:
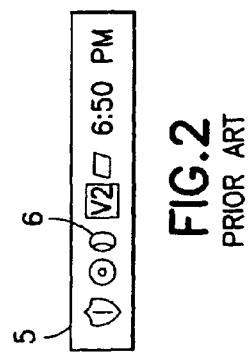
FIG. 2 shows a close up view of the systray in the taskbar pictured in FIG. 1.

FIG. 2 is a close up view of the systray in the taskbar pictured in FIG. 1. Of particular note, an icon 6 for a system volume dialogue is present. A user may click on the icon 6 to interact with the icon 6 and open a system volume dialogue.

Figure 3:
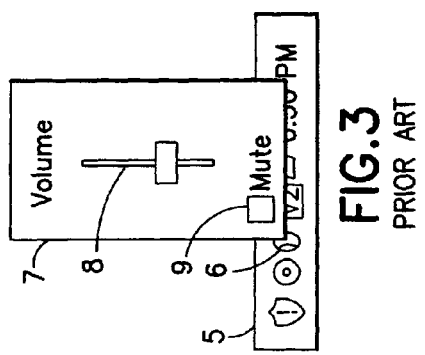
FIG. 3 illustrates the system volume dialogue presented when a user left-clicks on the volume icon in the systray shown in FIG. 2.

FIG. 3 illustrates the system volume dialogue 7 presented when a user left-clicks on the volume icon in the systray shown in FIG. 2. The system volume dialogue 7 for Windows XP comprises an adjustable slide 8 for raising or lowering the system volume and a mute checkbox 9 for muting the system volume. If a user desires to mute the sound of the system, the user left-clicks on the mute checkbox 9.

Figure 4:
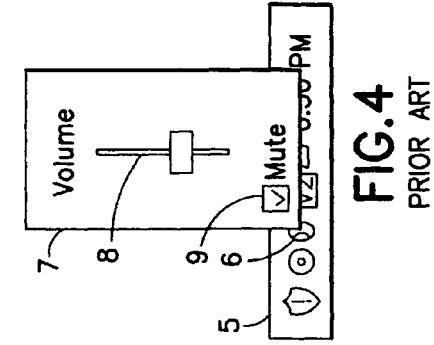
FIG. 4 depicts the system volume dialogue of FIG. 3 after a user has chosen to mute the sound.

FIG. 4 depicts the system volume dialogue 7 of FIG. 3 after a user has chosen to mute the sound by left-clicking on the mute checkbox 9. The mute checkbox 9 has a check-mark in the checkbox 9, indicating that the system sound is muted. As is apparent, in a conventional OS, a user may only mute all sound.

Figure 5:
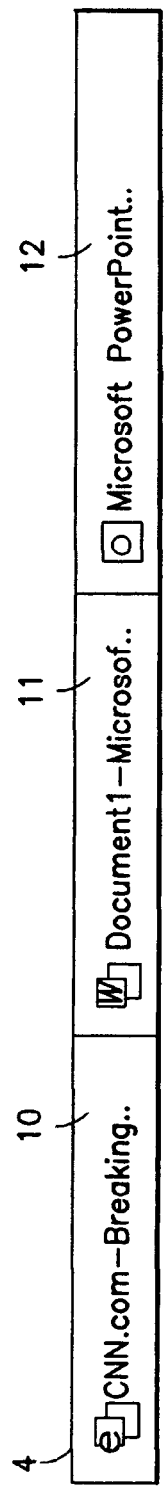
FIG. 5 depicts the applications region of the taskbar shown in FIG. 1.

FIG. 5 depicts the applications region 4 of the taskbar shown in FIG. 1. In the applications region 4, three applications are running as represented by their respective buttons: Internet Explorer (button 10), Microsoft Word (button 11), and Microsoft Power Point (button 12).

Figure 6:
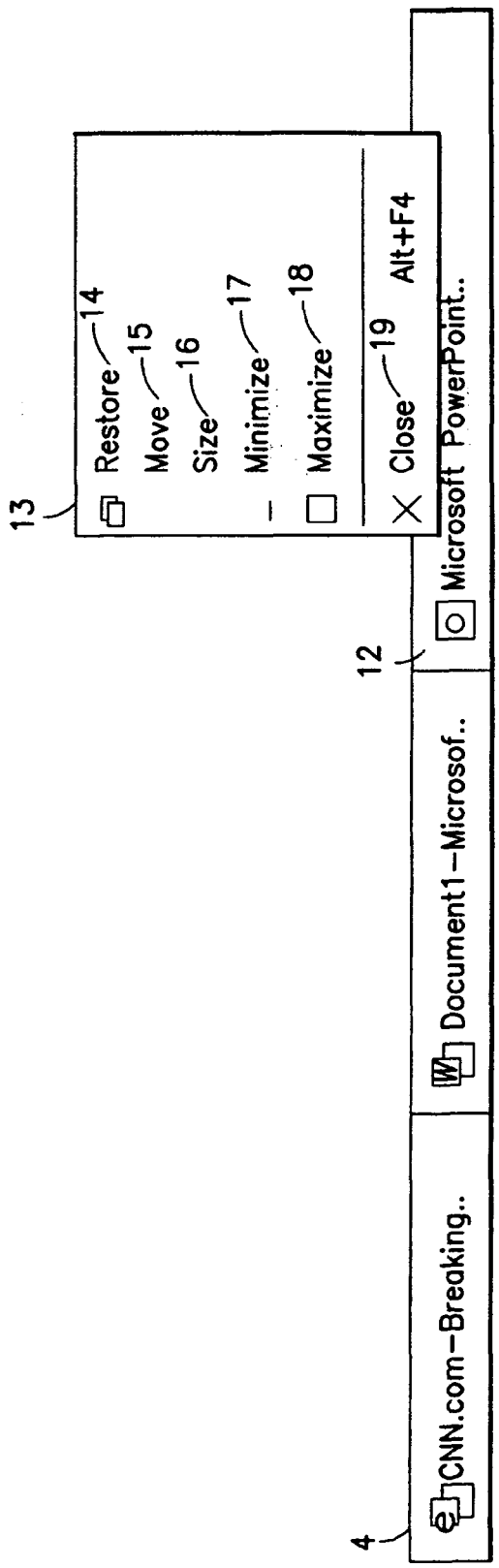
FIG. 6 illustrates a conventional menu that is presented when a user right-clicks on an application button in the applications region of FIG. 5.

FIG. 6 illustrates a conventional menu 13 that is presented when a user right-clicks on an application button 12 in the applications region 4 of FIG. 5. Here, a user right-clicked on the Microsoft Power Point button 12, opening the menu 13. The menu 13 consists of six possible actions: Restore 14, Move 15, Size 16, Minimize 17, Maximize 18, and Close 19. By left-clicking on one of the available actions, the user can effect that action on the program selected. Five of the commands, Restore 14, Move 15, Size 16, Minimize 17, and Maximize 18, relate to the size or position of the application's display window. The Close action 19 closes the application's display window, effectively exiting that application. This menu will help in further understanding exemplary embodiments of the invention as discussed below.

The conventional OS usually provides a volume control (e.g., system volume dialogue 7) with an option to mute all sounds. Should a user desire any other option, such as hearing sounds from one application but muting all other applications, the user has few options. The user may either close the applications he wishes to mute or mute applications by opening them, locating the volume control within each application, and turning off (e.g., or lowering) the sound in each application, one at a time. If even a few applications are running, this may be a long, tiresome process.

The latter is true because volume controls in many applications are buried in a menu structure and are not easily reachable. For instance, in an instance of the application Outlook 2002 in order to turn off sounds when email arrives, one has to select "tools", "options", "preferences", "email options", and "advanced email options", and then deselect "play a sound". Additionally, as a user navigates between applications, each application's menu structure may be different, which can be frustrating. For instance, one program may use a menu structure having volume controls under the heading of "play", then under the subheading of "volume", then under the sub-subheading of "up", "down", and "mute". The sub-subheadings must be selected to control volume. Another program may have a menu structure where volume controls occur under the heading of "options" and then the subheading of "sound", which turns the volume for the particular program on or off. It can be hard for users to determine and remember how to modify options to control sound when using multiple applications.

As illustrated previously, while a user would like easier techniques to mute one or more of a number of applications or perhaps to mute all applications except one, there currently is no way to easily perform this muting.

It is therefore desirable to provide techniques that enable a user to selectively mute up to n-1 applications of n applications, where n>1. This is accomplished in an exemplary embodiment by operating a highly surfaced, wide scoping and selective sound manager function that provides the user with an option to selectively mute up to n-1 applications of n applications, where n>1.

In an exemplary embodiment of the invention, a sound manager function, coupled to a user selection display, allows a user to select which applications the user desires to mute. A "user selection display" may be embodied as a dialogue or one or more components of a dialogue that enable a user to selectively mute applications. Though it is not required by the invention, a user selection display may include a component enabling a user to mute all applications.

A "sound manager function" is considered herein to be a function, module, application, task, product, component, element, or other comparable item able to perform the method steps and to create the apparatus described below.

The nature of an application being "muted" is considered herein to be that the muted application's volume is reduced by some amount. The application's volume need not be turned off entirely (e.g., zeroed), although exemplary embodiments of the invention include such a state. It is also understood that inasmuch as an application can be muted, the application can similarly be unmuted. The muted application's volume can be raised or turned back on, thus unmuting the application. Muting an application can be performed in any number of ways, examples of which are given below.

An "electronic device" is any powered (e.g., though alternating current, direct current, and/or battery) apparatus having a processing unit such as a data processor, microprocessor, digital signal processor, or other comparable component and one or more memories (e.g., internal and/or external to the processing unit). Typically, the processing unit will be a general purpose processor, and the processor will contain internal memory and have access to external memory. Exemplary electronic devices include as non-limiting examples computers, cellular phones, portable computers, and personal digital assistants.

Figure 7:
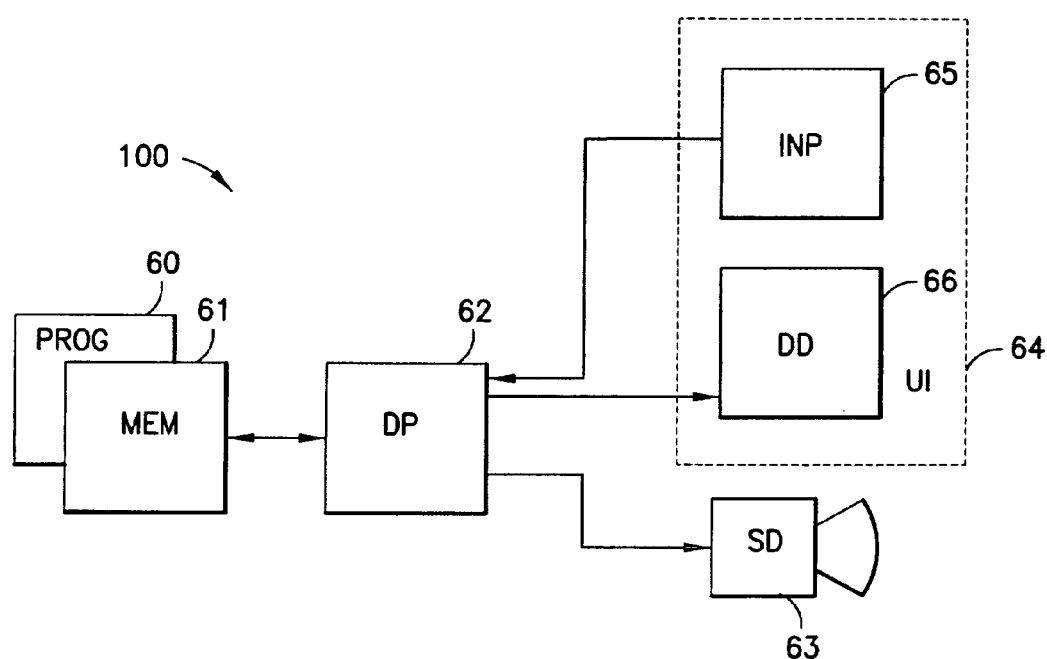
FIG. 7 is a simplified block diagram of an electronic device that is suitable for use in practicing the exemplary embodiments herein.

Reference is made first to FIG. 7 for illustrating a simplified block diagram of an electronic device 100, such as a computer, that is suitable for use in practicing the exemplary embodiments of this invention. In FIG. 7, the electronic device includes a memory (MEM) 61 that stores program code (PROG) 60, a data processor (DP) 62, at least one sound device (SD) 63, and a user interface (UI) 64 comprising at least one input device (INP) 65 and at least one display device (DD) 66. The SD 63 is any device enabled to produce audible sound. A non-limiting example of a SD 63 is a speaker or, e.g., any other type of device that transduces electrical energy to acoustic energy. The PROG 60 is assumed to include program instructions that, when executed by the DP 62, enable the electronic device to operate in accordance with the exemplary embodiments of this invention, as will be discussed below in greater detail. The PROG 60 may be part of operating system (not shown in FIG. 7) or separate from an operating system as described in more detail below. The at least one input device (INP) 65 includes any possible input to an electronic device, such as a mouse, trackball, voice, touch screen, and pen input.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk—read only memory (CD-ROM), compact disk—read/write (CD-R/W) and DVD.

Figure 8:
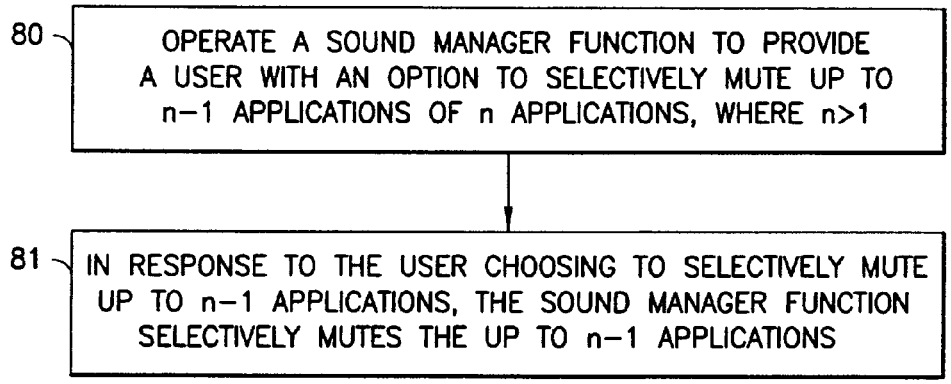
FIG. 8 is a flowchart illustrating an exemplary method for practicing exemplary embodiments herein.

FIG. 8 depicts a flow chart illustrating an exemplary method for practicing certain exemplary embodiments of this invention. The method is for managing sound in a plurality of device-executed applications. The method comprises the following steps. In box 80 of FIG. 8, the method operates a sound manager function to provide a user with an option to selectively mute up to n-1 applications of n applications, where n>1. In box 81, in response to the user choosing to selectively mute up to n-1 applications, the method's sound manager function selectively mutes the up to n-1 applications.

Figure 9:
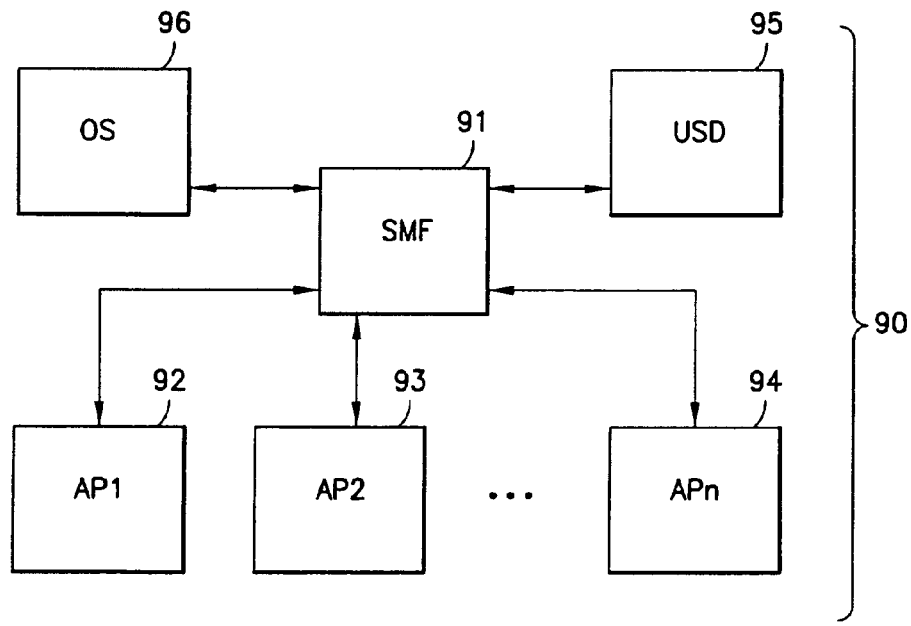
FIG. 9 is a simplified block diagram showing an exemplary set of software interactions involved in implementing various embodiments herein.

Turning now to FIG. 9, a simplified block diagram is presented showing an exemplary set of software interactions 90 involved in implementing various embodiments of the invention. In FIG. 9, the software interactions 90 include interactions between an operating system 96, a sound manager function (SMF) 91, a user selection display (USD) 95, and applications 92 through 94. The SMF 91 and USD 95 are part of the PROG 60 of FIG. 7. A sound manager function (SMF) 91, in accordance with the exemplary embodiments, manages sound in a plurality of device-executed applications, AP1 92 and AP2 93 through APn 94. A user selection display (USD) 95 allows a user to select which, if any, applications the user desires to mute. The USD 95 operates in conjunction with or under control of the SMF 91 and will also interact with the UI 64 to allow the user to select which, if any, applications the user desires to mute. Typically, the USD 95 displays selection dialogs such as volume dialogs (see FIGS. 10 and 11) and menus (see FIG. 12). A selection dialog is any element presented to a user that allows a user to select which, if any, applications the user desires to mute. The USD 95 would then indicate to the SMF 91 which of the applications, if any, are to be muted. The USD 95 may also be part of the SMF 91. The SMF 91 accomplishes muting by interacting with an operating system (OS) 96 and applications AP1 92 and AP2 93 through APn 94.

Figure 10:
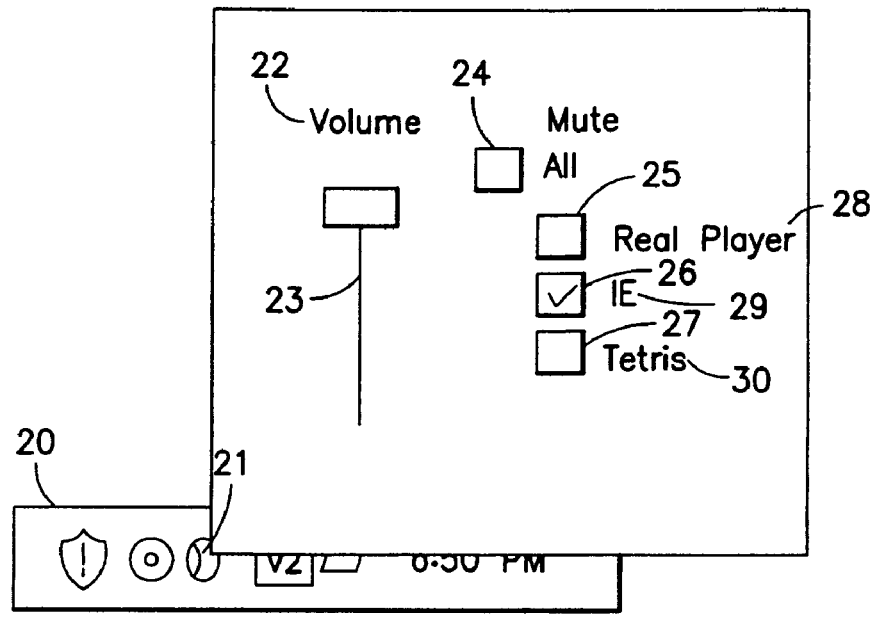
FIG. 10 shows an exemplary embodiment of the invention wherein the user selection display is a volume dialogue presented when a user left-clicks on the volume icon in a systray of a taskbar, and a user has chosen to selectively mute only one application, Internet Explorer (IE)

FIG. 10 shows an exemplary embodiment of the invention wherein the user selection display 95 (e.g., as shown in UI 64) is a dialog that is a volume dialogue 22 presented when a user left-clicks on the volume icon 21 in a systray 20 of a taskbar. The volume dialogue 22 comprises an adjustable slide 23 for raising or lowering the system volume, a mute all checkbox 24 for muting the sound from all the applications, and three application checkboxes 25, 26, 27 with three accompanying application identifiers 28, 29, 30. Should a user desire to selectively mute an application, the user left-clicks (for instance) on the empty checkbox, represented in FIG. 10 by checkboxes 25, 26, and 27, next to the appropriate application identifier, represented in FIG. 10 by application identifiers 28, 29, and 30. In the volume dialogue 22 displayed in FIG. 10, a user has chosen to selectively mute only one application, Internet Explorer (IE). This is represented by the IE checkbox 26 having a check-mark in the IE checkbox 26. The Real Player checkbox 25 and the Tetris checkbox 30 do not have check-marks in them and thus are not muted. Should either of these applications attempt to play sound, the sound will play through the sound device and the user will hear the sound. Should Internet Explorer attempt to play sound, the user will not hear sound from IE, as the user chose to selectively mute IE. It should be noted that the disclosed invention is not limited in any way to the applications of Real Player, I.E., and Tetris, and these applications are merely exemplary.

Figure 11:
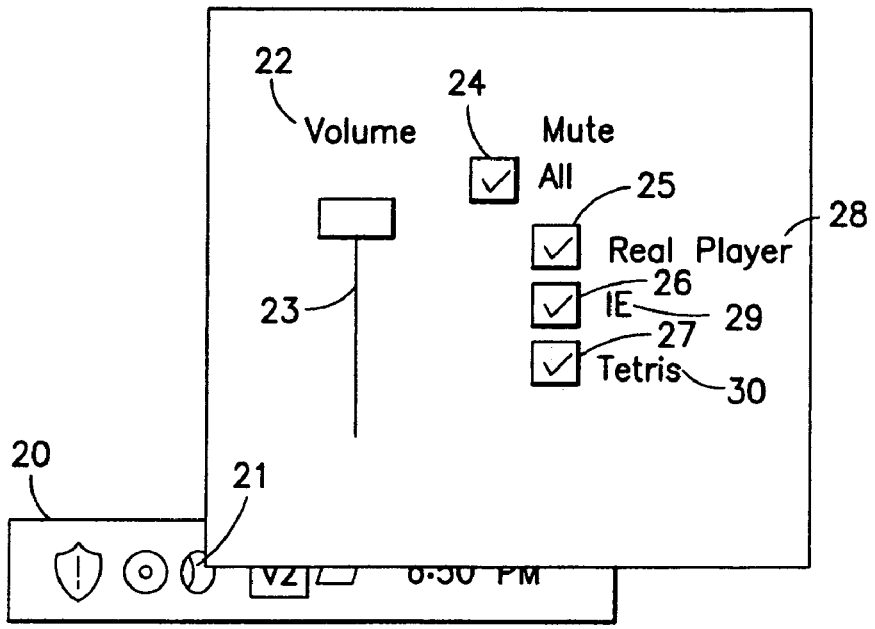
FIG. 11 illustrates the embodiment of FIG. 10 wherein a user has chosen to selectively mute three of three applications.

FIG. 11 illustrates the embodiment of FIG. 10 wherein a user has chosen to selectively mute all three applications. This is accomplished by the user left-clicking on the mute all checkbox 24. In so doing, the volume for all three applications, Real Player, Internet Explorer, and Tetris, is muted.

Thus, the check-marks in the checkboxes 25, 26, 27 are exemplary indicia indicating which applications 28, 29, 30, respectively, are muted. In the example of FIGS. 10 and 11, presence of a check-mark indicates muting while absence of a check-mark indicates no muting, but other techniques may be used. For instance, a check-mark could correspond to multiple applications instead of a single application as shown in FIGS. 10 and 11. It is also noted that indicia is not limited to check-boxes, and other items such as text (see FIG. 12), icons other than check-marks (e.g., perhaps an icon with a portion having a speaker and an indication of muting, such as "muted" in graphical form near or over the speaker or "Ø" near or over the speaker, an "x" icon), or some combination of text and icons may be used. The disclosed invention is not limited by the indicia described herein.

Figure 12:
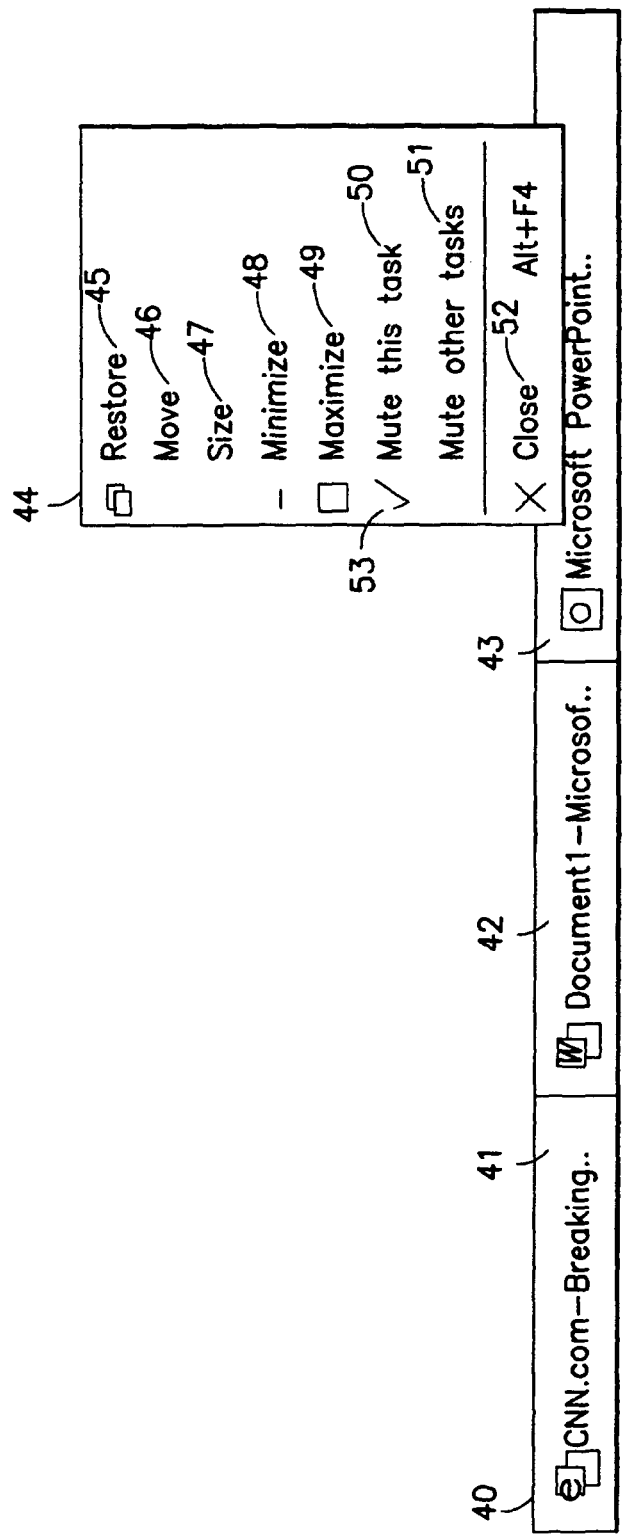
FIG. 12 shows an exemplary embodiment wherein the user selection display comprises additional menu choices available when a user right-clicks on an application button in the applications region of a taskbar.

FIG. 12 shows an alternate exemplary embodiment of the invention wherein the user selection display 95 (e.g., as shown in UI 64) comprises a dialog having additional menu choices available when a user right-clicks on an application button 43 in the applications region 40 of a taskbar. As in FIGS. 10 and 11, three applications are running, as represented by their respective buttons in the applications region 43: Internet Explorer (button 41), Microsoft Word (button 42), and Microsoft Power Point (button 43). A user right-clicked on the Microsoft Power Point button 43 and opened a menu 44. In accordance with exemplary embodiments of the invention, the menu 44 comprises eight possible actions: Restore 45, Move 46, Size 47, Minimize 48, Maximize 49, Mute this task 50, Mute other tasks 51, and Close 52. In addition to the six actions described with regards to FIG. 12, the menu 44 includes two additional actions: Mute this task 50 and Mute other tasks 51. In the example of FIG. 12, a "task" corresponds to an application. By, e.g., left-clicking on the Mute this task option 50, a user may selectively mute only the current application, Microsoft Power Point. In contrast, by, e.g., left-clicking on the Mute other tasks option 51, a user may selectively mute every application except the current one. In the example of FIG. 12, a check-mark 53 is an exemplary indicia used to indicate that the task is muted (e.g., the check-mark 53 appears) or is not muted (e.g., there is no check-mark 53). As another example, the Mute this task option 50 can be indicia that the Power Point application is not muted and an Unmute this task option (not shown) can indicate that the PowerPoint application is muted. As another example, the Mute other tasks option 51 is selected, this option could change to an Unmute other tasks options 51 (not shown). As a further example, if the Mute other tasks option 51 is selected, the indicia indicating that the applications Internet Explorer (button 41) and Microsoft Word (button 42) are muted would be presented in menus 44 corresponding to those applications.

Although shown with regards to a volume dialogue coupled to the systray and additional menu choices available when a user right-clicks on an application button in the applications region of a taskbar, these are two non-limiting embodiments of the invention. Those skilled in the art may appreciate additional embodiments for practicing the invention. As a non-limiting example, one additional embodiment the user selection display may comprise a dialogue that automatically appears or "pops-up" when a user runs more than one application.

Figure 16:
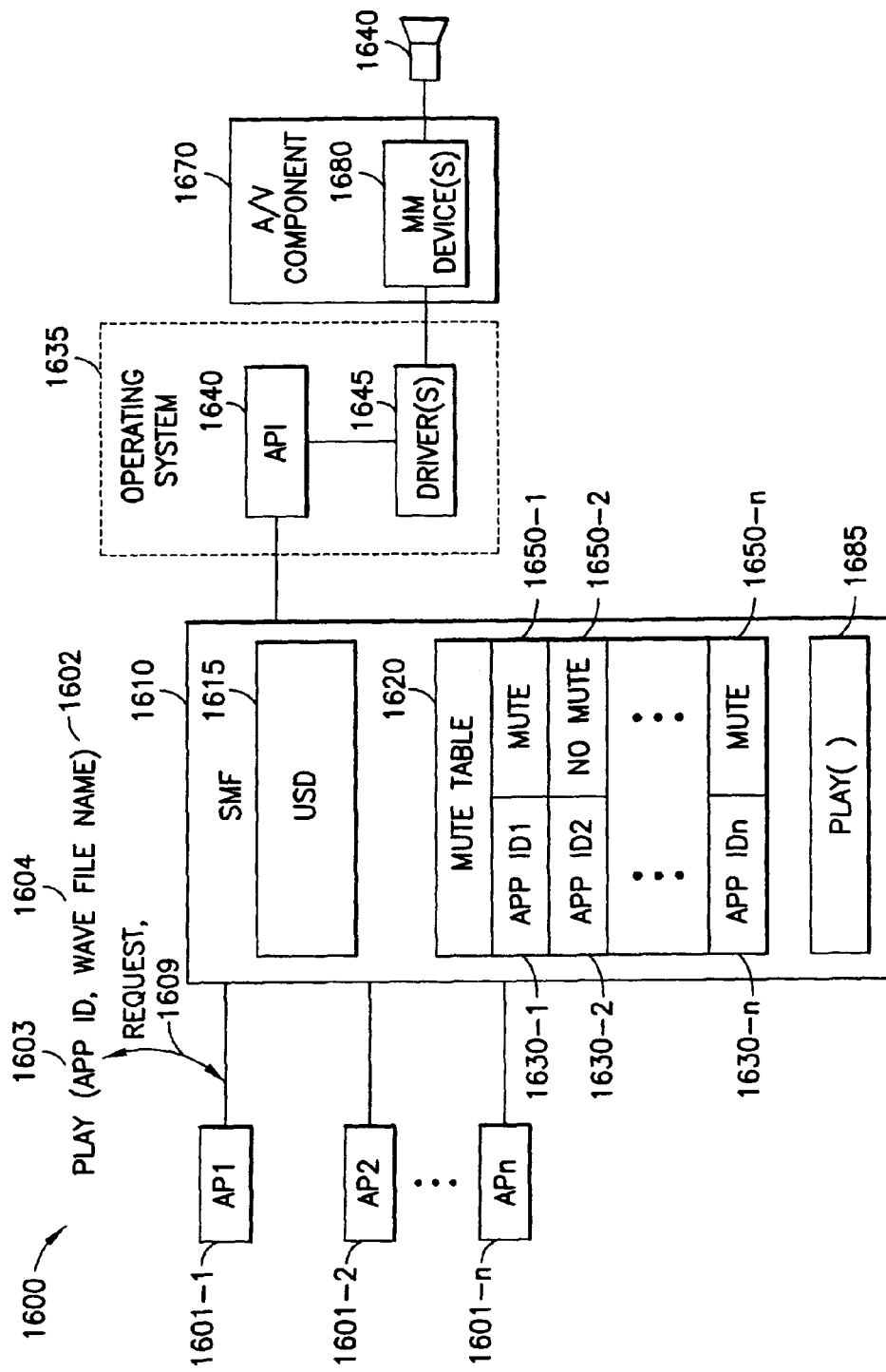
FIG. 16 is another exemplary block diagram illustrating potential software and hardware structure of the electronic device of FIG. 7.
Figure 17:
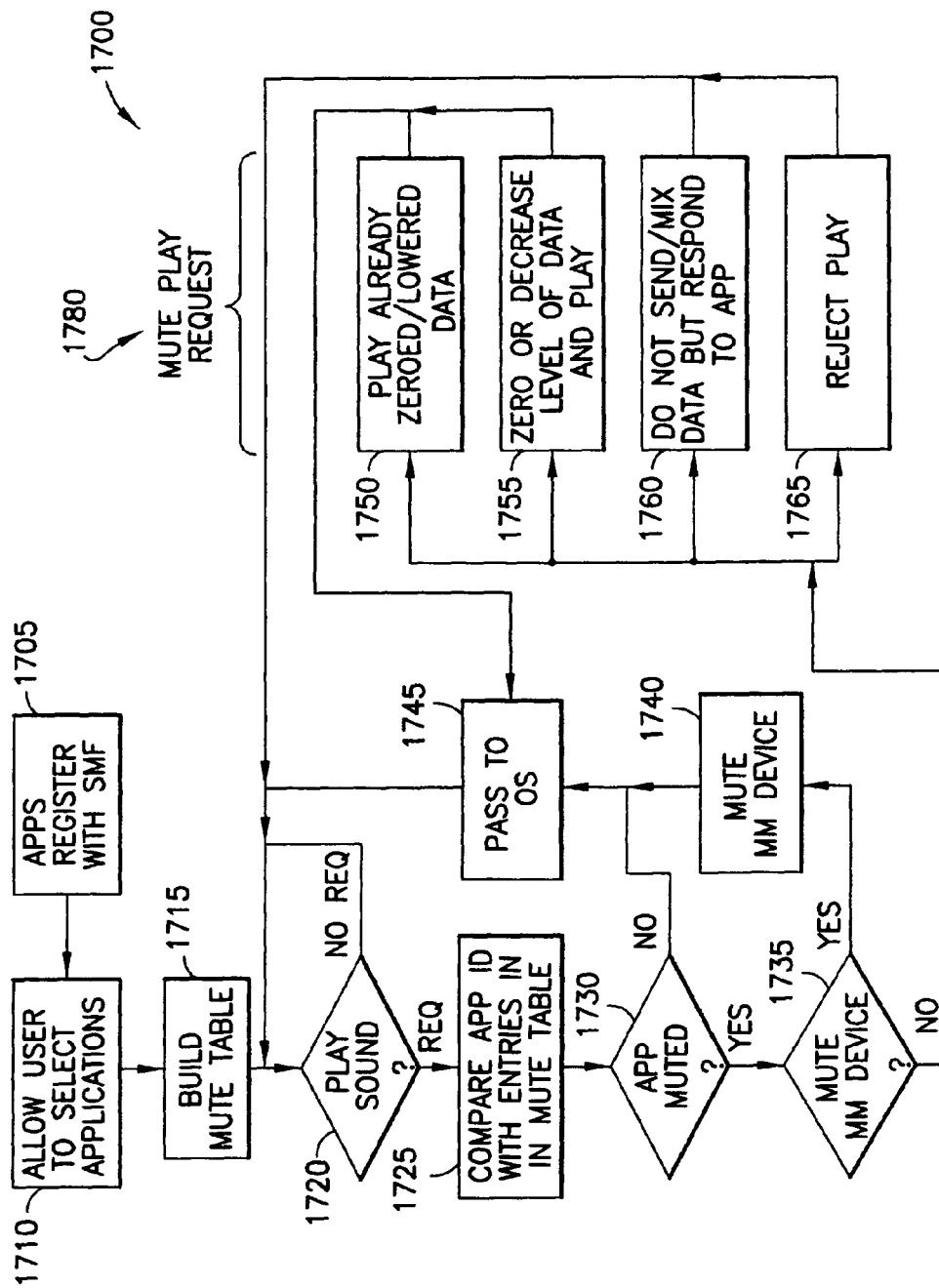
FIG. 17 is a flowchart of an exemplary method performed by the sound manager function of FIG. 16.

The relative location of the sound manager function 91, as shown in FIG. 4 and discussed elsewhere, is non-limiting. The sound manager function 91 may be coupled to any part of the electronic device or software that enables the sound manager function 91 to fulfill its function. As two non-limiting examples, the sound manager function 91 may be integrated with the operating system or the sound manager function 91 may be its own separate module. As a non-limiting example of a separate module, the sound manager function 91 may comprise a separate application. FIGS. 13-17 illustrate non-limiting examples of integrating a sound manager function 91 at least partially into an operating system (FIGS. 13-15) or having the sound manager function 91 implemented as a separate module (FIGS. 16 and 17).

Figure 13:
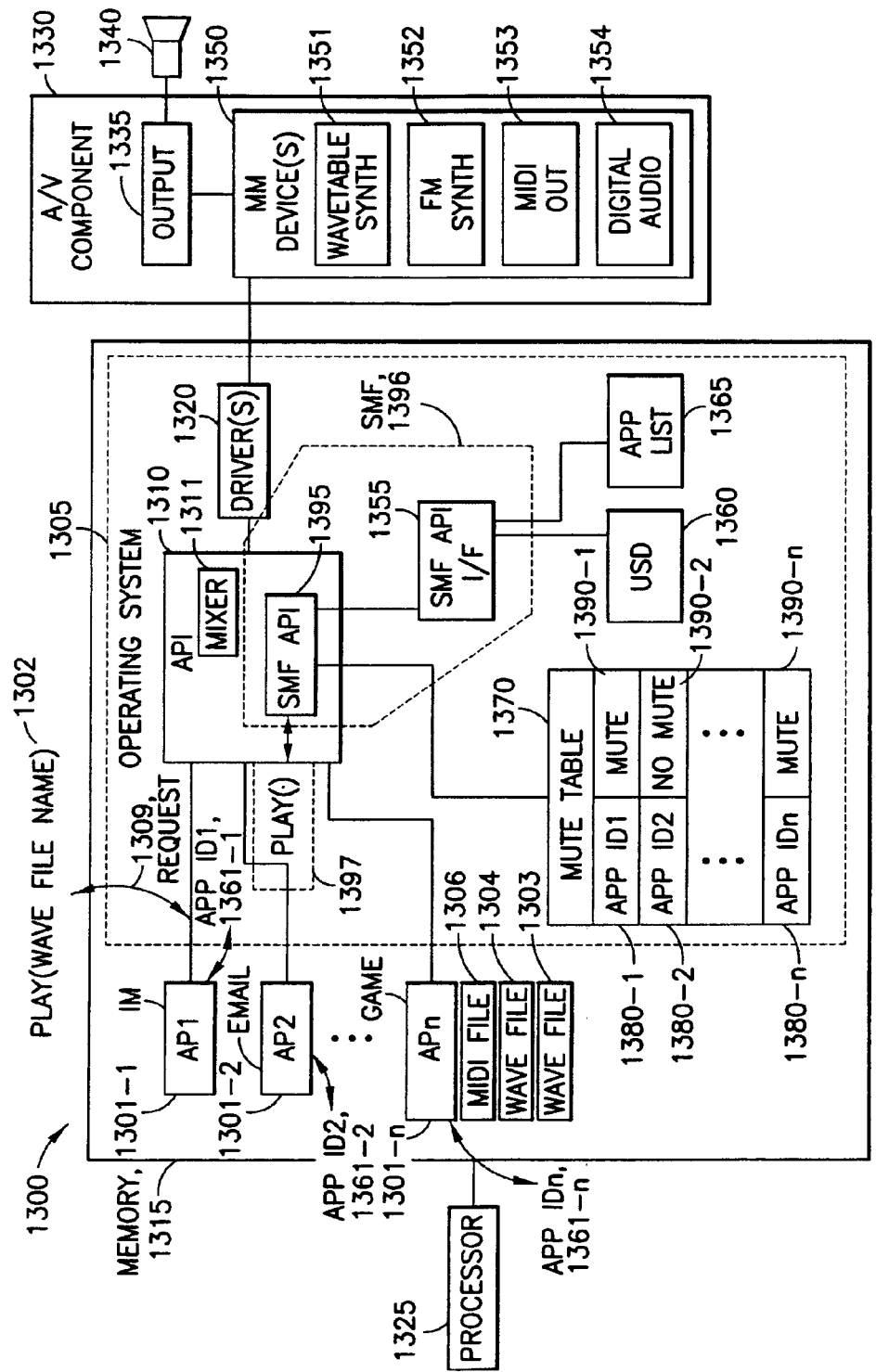
FIG. 13 is an exemplary block diagram illustrating potential software and hardware structure in the electronic device of FIG. 7.

FIG. 13 is an exemplary block diagram illustrating potential software and hardware structure in the electronic device of FIG. 7. FIG. 13 (and FIGS. 14 and 16) can be considered as a combination of both FIGS. 7 and 9, as both exemplary software and hardware structures are shown. Note that the user interface 64 of FIG. 7 is not shown in FIGS. 13, 14, and 16.

Electronic device 1300 in this example comprises a processor 1325 (e.g., a DP 62 of FIG. 7) coupled to both a memory 1315 and an Audio/Video (A/V) component 1330. The coupling (e.g., typically address, control, and data buses) between the processor 1325 and the A/V component 1330 is not shown for clarity. The memory 1315 comprises applications AP1 1301-1 through APn 1301-*n* coupled to an operating system 1305. Each application 1301 is associated with a corresponding application identification (ID) 1361. The operating system 1305 comprises an Application Programmer Interface (API) 1310, drivers 1320, a mute table 1370, a user selection display (USD) 1360, a mixer 1311, and an application list (App List) 1365. Also shown is an sound manager function (SMF) 1396, which comprises two components in this example: an SMF API 1395 and an SMF API interface (I/F) 1355. In this example, the A/V component 1330 is a hardware component that is assigned one or more addresses from the address space addressable by the processor 1325. Although one A/V component 1330 is shown, electronic device 1300 could contain more than one A/V component 1330. The MM device(s) 1350 are shown as being implemented on the A/V component 1330. A portion of one or more of the MM device(s) 1350 may also be implemented in memory 1315 or one or more of the MM device(s) 1350 could be completely implemented in memory 1315. For instance, certain audio codecs (compression-decompression programs) can be implemented in memory 1315 and, e.g., pass data to the digital audio 1354. It should also be noted that a current trend is toward adding multimedia functionality into processors 1325, and therefore some or all of the MM device(s) 1350 might be incorporated into the processor 1325.

The "memory" 1315 is read-only memory, read-write memory, or some combination thereof. The memory 1315 can include multiple modules and can include both short-term memories (e.g., random access memories) and long-term memories (e.g., hard drives, compact disk drives).

The A/V component 1330 comprises MultiMedia (MM) device(s) 1350 and an output 1335. Output 1335 is connected to a sound device 1340 (e.g., speaker or speaker amplifier and speaker). The A/V component 1330 is a sound card in this example but could be any apparatus able to convert data into analog or digital output suitable for output on a sound device. The MM device(s) 1350 comprise wavetable synthesizer (synth) 1351, Frequency Modulation (FM) synth 1352, MIDI out 1353, and digital audio 1354. Each of the MM device(s) 1350 is a device suitable for outputting data to the sound device 1340. The wavetable synth 1351 is a MM device that uses wave tables to play sounds and can be used for repetitive sounds such as those that occur in games. The FM synth 1352 is another MM device for generating sounds through FM. MIDI out 1353 is a Music Instrument Digital Interface (MIDI) device, typically used for longer, more musical sounds. The digital audio 1354 is a MM device used to play digital sounds, such as wave files. The digital audio 1354 will typically contain a Digital to Audio Converter (DAC) (not shown), although the output 1335 or even the sound device 1340 could contain the DAC.

The mute table 1370 comprises application identifications (APP IDs) 1380-1 through 1380-n. Additionally, the mute table 1370 also comprises n mute statuses 1390-1 through 1390-n. Each mute status 1390 has an indication (e.g., "Mute" and "No Mute") as to whether the corresponding Application ID 1380 is to be muted or not muted. The mute table 1370 is one exemplary technique for determining which applications 1301 are to be muted or not muted.

An A/V component 1330 can typically play sounds from many different sources such as a Compact Disk (CD) player, a Digital Versatile Disk (DVD) player, wave files, MIDI files, etc. There are also many different techniques for playing sounds in a computer. For instance, "high level", "mid-level", or "low-level" functions in the API 1310 could be used. What is desired is that when an application 1301 requests to play a sound, the sound would be muted (e.g., not played on the sound device 1340, played on the sound device 1340 at a zero values, or played on the sound device 1340 at some predetermined low value). How muting of a sound from an application 1301 occurs will depend on implementation. Some examples of implementation will be described herein, but these implementations are merely exemplary.

FIG. 13 also brings up an interesting point. Assume that the application AP1 1301-1 is an Instant Message (IM) application that plays wave file 1303 (e.g., stored on a hard drive) when an instant message is received. Additionally, the application AP2 1301-2 is an email application that plays wave file 1304 (e.g., stored on a hard drive) when an email is received. A user would typically have to turn off all sounds to stop sound from a particular application 1301, which would not be desirable if the user is waiting for an important email while using the IM application 1301-1. The user could go to the application 1301-1 and turn off sounds in this application, but this can be a time consuming process. It is noted that both IM application 1301-1 and email application 1301-2 both play wave files, which means that typically the same MM device 1350 (e.g., digital audio 1354) will be used. Because both the applications 1301-1 and 1301-2 use the digital audio 1354, it is typically not possible to mute the digital audio device 1354, which might be possible in some situations.

On the other hand, assume the application 1301-n is a game that is using MIDI file 1306 (e.g., stored on a CD used by the game application) and sounds are coupled to the MIDI out 1353, and the user would like to mute the email application 1301-2. In this case, it may be possible to mute the digital audio 1354 and therefore any requests 1309 for playing a sound could be muted by allowing the application 1301-2 to request the sound to be played (e.g., but muting the digital audio device 1354 would mean that the sound is "played" at a muted level). From the perspective of the application 1301-2, the application 1301-2 receives indications that the sound was played, when the digital audio 1354 actually was muted. This is explained in more detail below.

In the example that follows, it will be assumed that the application API 1301-1 requests 1309 to play the wave file 1303. The request 1309 could be any type of technique used by an application 1301 to play a sound. In this example, the request 1309 is in the form of a "play (.)" function call 1302 to a play function 1397 in the SMF API 1395. In this example, the play function call 1302 includes a WaveFileName which is a reference to the wave file 1303. When the App ID 1361-1 of the application 1302-1 matches the application ID 1380-1 having a No Mute mute status 1390-1, the play function 1397, in response to the requests 1309 by the application 1301-1 to play sounds, performs one or more actions so that the sounds (e.g., as embodied in the wave file 1303) are muted with respect to the sound device 1340.

In the specific example of a Windows operating system 1305, the Windows operating system 1305 includes several APIs 1310 used to play sounds. For instance, a Media Control Interface (MCI) is typically part of a Windows Software Development Kit (SDK) and provides API functionality. Another Windows API 1310 is DirectX, including "DirectSound" functions. Yet another API is MMIO, MultiMedia Input and Output. A wave file can be played using MCI, DirectSound, and MMIO (or combinations thereof), but for simplicity of exposition the exemplary descriptions that follow will use MCI as an example.

The SMF 1396 has in this example a portion built into the API 1310. The portion is the SMF API 1395. The SMF API 1395 is a modified set of functions (e.g., having MCI, DirectSound, and/or MMIO functions) that act in response to the request 1309 to perform one or more actions so that the sound (e.g., as represented by the wave file 1303) is muted with respect to the sound device 1340. For instance, the MCI API has a function called PlaySound having parameters of LPCSTR pszsound (a string pointing to a sound to play), HMODULE hmod (a handle to an executable file), and DWORD fdwSound (flags for playing the sound). PlaySound is typically used when a specific waveform-audio device driver is not necessary and an entire sound would be played. Another exemplary function in the MCI API is a waveOutWrite function that is used to send a data block to a waveform-audio device. The waveOutWrite function has the parameters of HWAVEOUT hwo (a handle to the waveform-audio device), LPWAVEHDR pwh (pointer to a WAVEHDR structure containing information about the data block), and UINT cbwh (size, in bytes, of the WAVEHDR structure). In contrast to the PlaySound function, the waveOutWrite function operates at a lower level and requires more work by the application 1301 to play a wave file. More information about PlaySound, waveOutWrite, and other APIs can be found at the Internet pages for Microsoft's SDK.

An exemplary play function call 1302 as a request 1309 would be one of the PlaySound or waveOutWrite function calls. The SMF API 1395 has modified versions (as illustrated by play function 1397) of the PlaySound or waveOutWrite functions. In response to receiving the request 1309 (e.g., as PlaySound or waveOutWrite function calls 1302), the modified PlaySound or waveOutWrite functions (as illustrated by play function 1397) would then ensure that sound corresponding to the wave file 1303 is muted. Such techniques for muting the sound corresponding to the wave file 1303 are described in more detail in reference to FIG. 15.

The SMF API 1395 (and the play function 1397) should be able to determine which applications 1301 are associated with which request 1309. In other words, the play function 1397 should be able to determine which application 1301 is calling the function 1397. To aid in this regard, the SMF API I/F 1355 can use an application list 1365 provided by the operating system 1305 to inform the SMF API 1395 of which application IDs could call the function 1397. If the play function 1397 cannot discern which application 1301 is the calling application, the play function 1397 could require that each application 1301 requesting to play a sound provide an application ID 1361-1. For instance, the PlaySound has a value for the fdwSound parameter of SND_APPLICATION, which means that the sound is played using an application-specific association. The application ID 1361-1 could be determined using the application-specific association. As another example, the (already modified) PlaySound and waveOutWrite functions could also be further modified to require a parameter of the application ID 1361, so that the modified PlaySound and waveOutWrite functions could determine the calling application 1301.

The play function 1397 (e.g., as modified PlaySound or waveOutWrite functions) compares the determined application ID 1361-1 with the application IDs 1380. If the application ID 1361-1 matches with an application ID 1380, the play function 1397 checks the mute status 1390 that corresponds to the application ID 1380. In the example of FIG. 13, the determined application ID 1361-1 matches the application ID 1380-1, and the mute status 1390-1 is "Mute", indicating that action should be taken by the play function 1397 such that the requests 1309 by application 1301 to play a sound are muted. This is described in greater detail in FIG. 15.

The SMF API I/F 1355 in this example queries the operating system 1305 to determine an application list 1365. The application list 1365 is a list of those applications 1301 that are running. For instance, the Task Manager in Windows contains a list of applications that are running. Note that applications 1301 may also comprise processes or threads, if these can also use sound and can be associated with an identification allowing requests 1309 to be acted on.

The USD 1360 as described above allows a user to select applications 1301 for muting. The SMF API I/F 1355 conveys information from the USD 1360 and the application list 1365 to the SMF API 1395 (e.g., to the play function 1397), which builds the mute table 1370.

The mixer 1311 is a device included in some operating systems 1305. The mixer 1311 mixes sound data (e.g., as embodied in the files 1303, 1304, and 1306) from a number of applications 1301 prior to being sent to an A/V component 1330 and/or a MM device 1350. In other words, if two applications choose to play wave files (e.g., wave files 1304 and 1303), the data from the wave files will be mixed together by the mixer 1311 prior to being sent to the A/V component 1330/MM device 1350. Similarly, data from different file types, e.g., wave and motion picture experts group MPEG 1, layer III (commonly known as "mp3") (latter not shown), can also be mixed by mixer 1311.

Depending on implementation, the mixer 1311 could include the functionality of the SMF 1396 such that the SMF API 1395 would not be used. In this example, the mixer 1311 would then perform muting using mute table 1370. As another example, the SMF API 1395 operates prior to any mixing performed by the mixer 1311. As yet another example, the SMF API 1395 could operate in conjunction with the mixer 1311 to mute applications 1301. Illustratively, the SMF API 1395 could message the mixer 1311 that the data being transferred should be muted (e.g., set to zero or a predetermined value). The mixer 1311 could also reside outside the API 1310.

Figure 14:
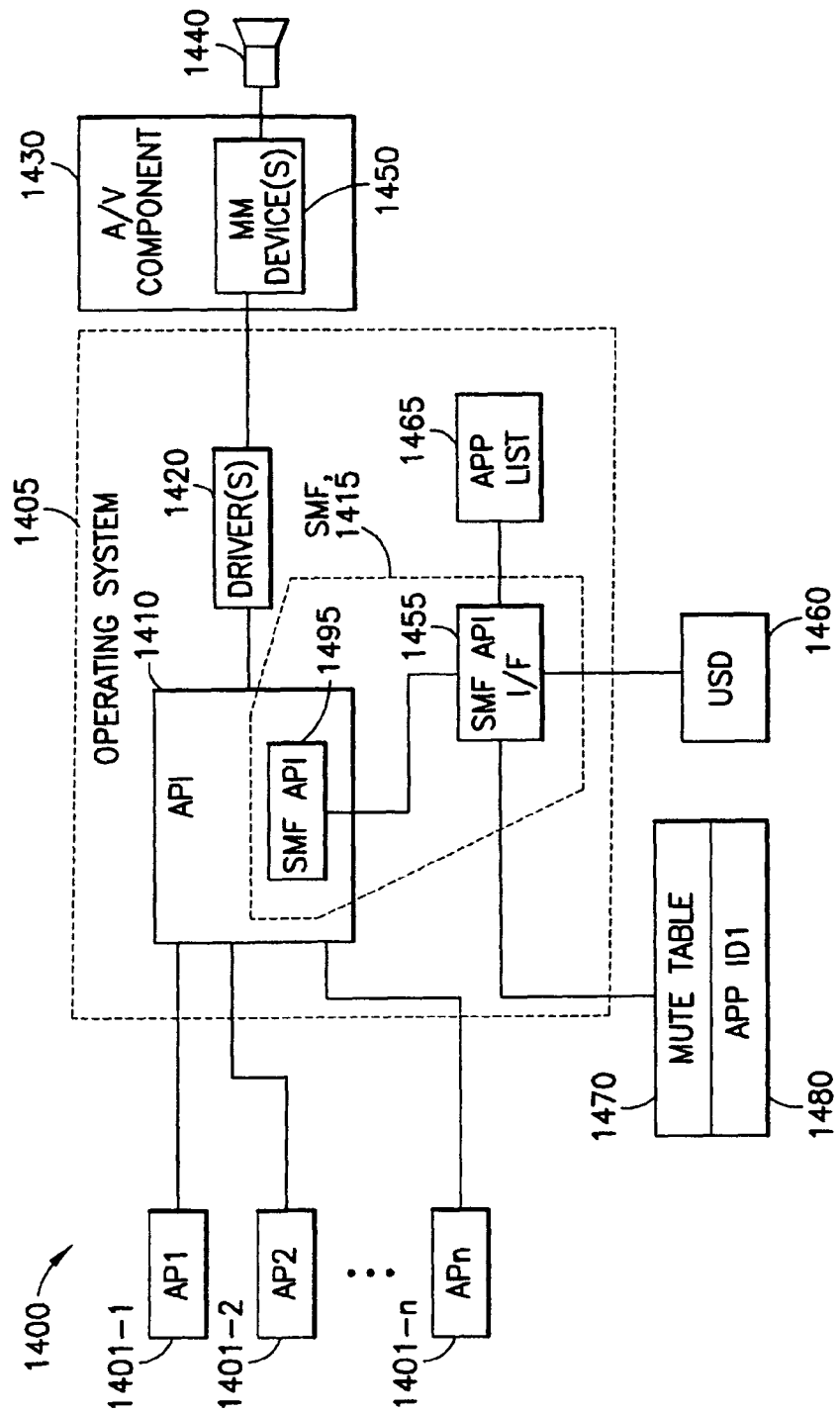
FIG. 14 is another exemplary block diagram illustrating potential software and hardware structure in the electronic device of FIG. 7.

FIG. 14 is another exemplary block diagram illustrating potential software and hardware structure in the electronic device of FIG. 7. In this example, the electronic device 1400 comprises applications 1401-1 through 1401-n, an operating system 1405, an A/V component 1430, a mute table 1470, a USD 1460, and a sound device 1440. The processor and memory of FIG. 13 are not shown, but the applications 1401-1 through 1401-n, operating system 1405, mute table 1470, and USD 1460 would typically reside in a memory. The A/V component 1430 comprises MM devices 1450. The operating system 1405 comprises an API 1410, drivers 1420, an SMF 1415, and an application list 1465. The SMF 1415 is again divided into two components, and SMF API 1495 and an SMF API I/F 1455. Note that the SMF API I/F 1455 can be combined with the SMF API 1495 and placed into the API if desired.

In the example of FIG. 14, the SMF API I/F 1455 creates the mute table 1470 from the application list 1455 and information provided by a user through the USD 1460. Note also that the SMF API I/F 1455 can pass a list of applications 1401 able to be muted, determined using the application list 1465, to the USD 1460. The mute table 1470 has application IDs 1480 of only those applications 1401 to be muted. In this example, only application 1401-1 (corresponding to application ID1 in 1480) is to be muted. The SMF API I/F 1455 interacts with the SMF API 1495 so that the SMF API 1495 (e.g., the play function 1397 shown in FIG. 13) can determine which applications 1401 are muted. The SMF API 1495 can pass the App ID 1461 to the SMF API I/F 1455 and receive back an indication of whether a corresponding application 1401 is muted.

Figure 15:
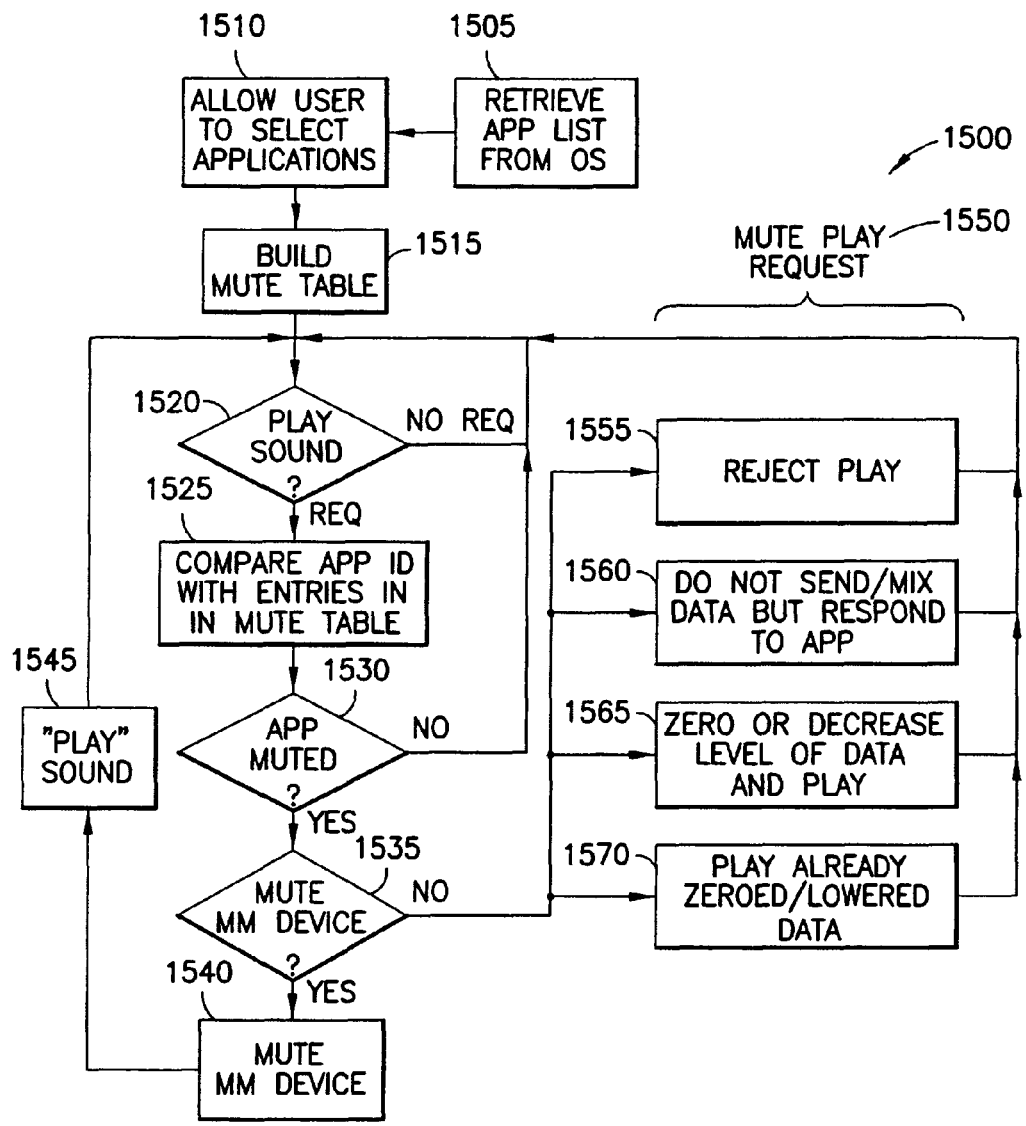
FIG. 15 is a flowchart of an exemplary method performed by the sound manager function of FIGS. 13 and 14.

Referring to FIG. 15 with appropriate reference to FIGS. 13 and 14, FIG. 15 is a flowchart of an exemplary method performed by the sound manager function (SMF) of FIGS. 13 and 14. Method 1500 begins in step 1505 when the SMF retrieves the application list from the operating system. In step 1510, the user is allowed (e.g., using the USD 1360 or 1460) to select applications for muting. Using the application list and the selections from the user, the SMF builds a mute table in step 1515. Note that method 1500 assumes that applications selected for muting in the example of FIG. 15 will be muted once the applications request sounds to be played. It may also be possible for the application to be immediately muted, but this might be harder depending on how the application is playing sounds. If wave sounds are currently being played, then waveOutPause function may be used to pause playback and waveOutReset may be used to stop playback. However, the current application would have to be known to be associated with a MM device.

In step 1520, the SMF determines if any application has requested to play a sound. If there is no request (step 1520=NO REQ), the method 1500 waits. One way for step 1520 to be performed is when a function (e.g., in the SMF API) is called. For instance, if the play function 1397 is called by an application 1360 in FIG. 13, the play function 1397 then automatically "knows" that a sound is requested to be played. Another option would be for the operating system to have a function that requires each application to query if the application is allowed to play a sound. Yet another option occurs when an application attempts to open a MM device 1350 through the use of an, e.g., "open" function. For example, the MCI API has a waveOutOpen function that opens a given waveform-audio output device. This function could communicate with another part of the operating system that the application is going to start using the waveform-audio output device. If an application requests a sound to be played (step 1520=REQUEST), the SMF in step 1525 compares the application ID of the application requesting to play the sound with application IDs in the mute table.

If the application has not been muted (step 1530=NO), method 1500 continues in step 1520. If the application has been muted (step 1530=YES), the SMF can undertake a number of different actions in order to mute the application. Exemplary actions are shown in steps 1540 and 1550. Method 1500 continues in step 1535 when the application has been muted (step 1530=YES), as selected by a user. Otherwise (step 1530=NO), the method 1500 continues in step 1520.

In step 1535, it is determined if the MM device itself can be muted. For instance, if may be possible to determine if the only application on the MM device is the application requesting the sound to be played. As an example, if the MM device is not being used (as determined, e.g., by the waveOutOpen function), then the application should be the only application using the MM device. As another example, if there are two applications using the MM device and both are muted, the MM device itself can be muted (step 1540) using, e.g., the waveOutSetVolume function, set to a predetermined low value or a zero value. It should be noted that the waveOutSetVolume function can change volume on a per-device or per-instance (e.g., two applications, where each application has an instance of the device) setting. It should also be noted that not all devices support setting the volume, and the method 1500 (e.g., and the SMF) should determine whether the device supports setting a volume prior to performing step 1540 (e.g., as part of step 1535). Depending on how the SMF API is implemented, it may or may not be possible to determine how many applications are using a particular MM device. If it is not possible to determine how many applications are using a particular MM device, then the MM device typically should not be muted. The exception would be if there is only one application that can play sounds.

In step 1545, the sound is "played" by the MM device that has been muted in step 1540. The data (e.g., as embodied in wave file 1303 of FIG. 13) for the sound could therefore be transferred to the device, but because the device is muted, the data would be played at the muted level. In other words, the sound is played but the MM device is muted and the application will receive any messages from the SMF API as if the sound was played normally. As another example, the data might not be transferred to the device and instead any response to the application from the SMF API will occur during step 1545. It should be noted that if playing the sound "unmutes" the MM device, then perhaps another action should be taken as illustrated by step 1550.

If the MM device cannot be muted (step 1535=NO), then method 1500 continues in step 1550. Step 1550 describes a number of actions to be taken for muting sounds corresponding to a play request. Depending on implementation, one of the actions 1555, 1560, 1565, or 1570 would be chosen. In step 1555, the request (e.g., request 1309 of FIG. 13) is rejected. For example, a modified PlaySound function (e.g., play function 1397) would exit with an error, such as "sound cannot be played" or "sound not played because of application muting". Method 1500 would continue at step 1520. Step 1555 is an action that may cause the application to repeat the request to play a sound. Because of this, rejecting play in step 1555 might have limited use.

The other actions in steps 1560, 1565, and 1570 provide responses to the application requesting the sound to be played (the "muted application") indicating the sound has been played. In this manner, the muted application will receive appropriate responses, such as that the sound has been played. In step 1560, the SMF acts such that data corresponding to the sound is not sent to the A/V component/MM device but responses are sent to the muted application as if the data corresponding to the sound was sent to the A/V component/MM device. In the example of step 1560, the data corresponding to the sound would not be communicated to a mixer (e.g., by mixer 1311 of FIG. 13). As another example, the mixer 1311, as part of the SMF 1396, would receive data corresponding to the sound but would not mix the data from the muted application with data from other applications, and therefore the data from the muted application would not get sent to the AN component/MM device.

In step 1565, another action is taken by the SMF. In this action, the SMF zeros the level of data or decreases to a predetermined value the level of data corresponding to the sound. The muted data is played "normally" so that the application receives communications about, e.g., progress of playing the sound. For instance, a wave file will typically contain samples having a certain number of bits. For CD-quality music, there would be two channels of music having 16 bits per sample at 44.1 kHz. Each sample could be zeroed prior to transfer to the AN component/MM device. It should also be noted that the samples could be zeroed prior to the mixer, should the operating system have a mixer, or the mixer itself could perform the zeroing. The muting may also be performed by decreasing the data to predetermined value. In terms of sound processing, "decreasing to a predetermined value" may entail making the maximum value for a sample of sound be a predetermined value. For instance, for signed 16 bits, the maximum positive value for a sound is 8FFF hexadecimal (H). The muting could be performed by mapping each value for a sample from the positive range of 0000H to 8FFFH to within the range of 0000H to 00FFH for instance.

In step 1570, instead of playing data from the sound, the SMF plays already zeroed data or data already lowered (e.g., decreased) to a predetermined value. Illustratively, if a sound of the application is a common sound such as a sound used when selecting a menu item in a pulldown menu, a copy of the original sound can be stored in memory. The copy is a muted version of the original sound. The copy would be played in step 1570. As another example, applications typically use only a few sounds. The SMF API, upon initially muting an application, could make a copy of a sound requested to be played by the application. The copy would be stored at a muted level and the next time the muted application requests to play the sound, the copy would be played, thereby muting the application. Note that copies may be made by copying data from one file to a second file, where the second file has modified data so that a sound replayed using the modified data would be muted.

After an action is taken in step 1550, the method 1500 continues in step 1520. Thus, method 1500 shows examples of actions taken so that sounds requested to be played by a selected, muted application are muted with respect to a sound device.

In the examples of FIGS. 13-15, the operating system was modified, and in particular portions of the sound or multimedia API(s) for playing sounds were modified. These modifications allowed an SMF to mute applications. In the examples of FIGS. 16 and 17, the SMF is implemented separately from the operating system. This may occur, for instance, if Java is being used to play sounds and the SMF, as Java is typically not part of the operating system. This may also occur if the operating system is not available for modification.

Turning now to FIG. 16, another exemplary block diagram illustrating potential software and hardware structure of the electronic device of FIG. 7 is shown. In FIG. 16, the electronic device 1600 comprises n applications 1601-1 through 1601-n, an SMF 1610, an operating system 1635, an A/V component 1670 and a sound device 1640. Not shown is the processor and memory, but the applications 1601, SMF 1610 and operating system 1635 would be part of a memory and executed by the processor. The SMF 1610 comprises a USD 1610, a mute table 1620, and a play function 1685. The mute table 1620 comprises n application IDs 1630-1 through 1630-n, and n mute statuses 1650-1 through 1650-n. The operating system 1635 comprises an API 1640 and driver(s) 1645. The A/V component 1670 comprises MM device(s) 1680.

In this example, the SMF 1610 operates between the applications 1601 and the operating system 1635. In particular, the applications 1601 would interoperate with the SMF 1610 to play sounds. Instead of calling the API 1640 directly, the applications 1601 would call the SMF 1610. The SMF 1610 could therefore be, e.g., an API outside the operating system 1635, could be its own application, or could be a set of callable functions. The applications again use a request 1609, such as a call 1602 to the play function 1685. The call 1602 has parameters of AppID 1603 and WaveFileName 1604. The AppIID 1603 parameter identifies the calling application 1601. The WaveFileName in this example is a reference to a file containing information used to produce a sound on the sound device 1640.

The SMF 1610 would operate to compare a request 1609 from an application 1601 with the mute table 1620. The AppID 1603 parameter is compared with the application IDs 1630. In this case, the AppID 1603 from the application 1601-1 would match with the application ID 1630-1, the corresponding mute status 1650-1 is Mute. The mute status 1650-1 indicates that the application 1601-1 should be muted. Consequently, the SMF 1610 takes one or more actions so that the sound corresponding to the WaveFileName 1604 parameter will be muted. Such actions are in this example taken by the play function 1685. Exemplary actions are described in reference to FIG. 17.

If the application 1601 is not muted, the play function 1685 will then cause a sound corresponding to the WaveFileName 1604 to be played on the sound device 1640. Such operations are typically performed by calling an appropriate function (not shown) on API 1640 of operating system 1635. For instance, the play function 1685 could call a PlaySound (.) function on the API 1640.

It should be noted that the play function 1685 in this example is for operating on wave files. However, this is merely exemplary and the play function 1685 can operate on other files, such as mp3s and other multimedia files. Additionally, the "play" function itself is exemplary and other functions suitable for playing sounds may be used.

Turning now to FIG. 17 with appropriate reference to FIG. 16, a flowchart is shown of an exemplary method 1700 performed by the SMF 1610 of FIG. 16. Method 1700 begins in step 1705 when the applications 1601 register with the SMF 1610. The applications 1601 register with the SMF 1610 so that the SMF 1610 can determine which applications 1601 are available for muting. The registration process allows the SMF 1610 to build the application IDs 1630 portion of the mute table 1620. The applications 1601 in step 1705 would therefore typically communicate their application IDs to the SMF 1610, or the SMF 1610 could determine the application IDs, e.g., using the operating system 1635. In step 1710, the SMF 1610 allows (e.g., using the USD 1615) a user to select applications for muting. The SMF 1610 in step 1715 uses the results of steps 1705 and 1710 to build the mute table 1620.

In an exemplary embodiment, the SMF 1610 acts as a "wrapper" function that encompasses a call to a secondary function in the API 1640. Certain parameters passed to the wrapper (SMF 1610) are passed to the secondary call (a function in API 1640) and the return value from the secondary call (the function in API 1640) is returned to the original caller (an application 1601).

In step 1720, the SMF 1610 determines if any application 1601 has requested to play a sound. If there is no request (step 1720=NO REQ), the method 1700 waits. One way for step 1720 to be performed is when a function (e.g., in the SMF 1610) is called. For instance, if the play function 1685 is called by an application 1601, the play function 1685 then automatically "knows" that a sound is requested to be played. Another option occurs when an application attempts to open a MM device 1680 through the use of an, e.g., "open" function. For example, the MCI API has a waveOutOpen function that opens a given waveform-audio output device. This function could communicate with another part of the operating system that the application is going to start using the waveform-audio output device. The SMF 1610 acts to "intercept" (e.g., as a wrapper function) this waveOutOpen function and to pass appropriate function calls to the API 1640.

If an application 1601 requests a sound to be played (step 1620=REQUEST), the SMF 1610 in step 1625 compares the application ID (e.g., AppID 1603) of the application requesting to play the sound with application IDs 1630 in the mute table. If the application 1601 has been muted (step 1630=YES), the SMF 1610 can undertake a number of different actions in order to mute the application 1601. Exemplary actions are shown in steps 1740 and 1780. Method 1700 continues in step 1735 when the application has been muted (step 1730=YES), as selected by a user.

Otherwise (step 1730=NO), the method 1700 continues in step 1745, where the SMF 1610 passes the function call 1602 to the operating system 1635. Note that the function call 1602 can be changed if desired. For instance, the function call 1602 of play (AppID, waveFileName) could be changed to play (waveFileName), where "play (waveFileName)" is supported by the API 1640. Any return values or messages from the play (waveFileName) would be returned to the calling application in step 1745.

In step 1735, it is determined if the MM device 1680 itself can be muted. For instance, if may be possible to determine (e.g., by the SMF 1610 calling function(s) in the API 1640) if the only application on the MM device 1680 is the application 1601 requesting the sound to be played. As an example, if the MM device 1680 is not being used (as determined, e.g., by the waveOutOpen function), then the application 1601 should be the only application using the MM device 1670. As another example, if there are two applications 1601 using the MM device 1680 and both are muted, the MM device 1680 itself can be muted (step 1640) using, e.g., the waveOutSetVolume function, set to a predetermined low value or a zero value. This has been described above in reference to step 1535 of FIG. 15. Depending on how the SMF 1610 and the operating system 1635 are implemented, it may or may not be possible to determine how many applications are using a particular MM device 1680, to mute a MM device, or to maintain a muting of a MM device when a request to play a sound is passed to the operating system 1635. If it is not possible to determine how many applications 1601 are using a particular MM device 1680, then the MM device 1680 typically should not be muted. If the MM device is muted in step 1745, the call 1602 to the SMF 1610 is passed to the operating system 1635 (e.g., the API 1640) in step 1745. Note that step 1745 assumes that the operating system 1635 will not override the muting of the MM device 1680 that occurred in step 1740.

If the MM device 1680 cannot be muted (step 1735=NO), then method 1700 continues in step 1780. Step 1780 describes a number of actions to be taken for muting sounds corresponding to a play request. Depending on implementation, one of the actions 1750, 1755, 1760, or 1765 would be chosen. In step 1765, the request 1609 is rejected. For example, the call 1602 (e.g., to play function 1685) would exit with an error, such as "sound cannot be played" or "sound not played because of application muting". Method 1700 would continue at step 1720. Step 1765 is an action for which the application 1601 can be written to accept.

The other actions in steps 1750, 1755, and 1760 provide responses to the application requesting the sound to be played (the "requesting application") indicating the sound has been played. In this manner, the application will receive appropriate responses. It should be noted that an appropriate response may be "the device is not available" or some other error. In step 1760, the SMF 1610 acts such that data corresponding to the sound is not sent to the A/V component 1670 or MM device 1680 but responses are sent to the application 1680 as if the data corresponding to the sound was sent to the A/V component 1670 and MM device 1680. In the example of step 1760, the data corresponding to the sound would not be communicated to a mixer (e.g., see mixer 1311 of FIG. 13).

In step 1755, another action is taken by the SMF 1610. In this action, the SMF 1610 zeros the level of data corresponding to the sound or decreases to a predetermined value the level of data corresponding to the sound. The muted data is played "normally" so that the application receives communications about, e.g., progress of playing the sound. Thus, the modified data in step 1755 is passed to the operating system 1635 (e.g., the API 1640) in step 1745. In this example, instead of passing the WaveFileName 1604 parameter to the API 1640, the SMF 1610 would extract data from the file referred to by the WaveFileName 1604, modify the extracted data, and pass the modified data to a function in the API 1640. For example, the SMF 1610 could use the waveOutWrite function of an API 1640.

In step 1755, instead of playing data from the sound, the SMF plays already zeroed data or data already lowered (e.g., decreased) to a predetermined value. As described above, if a sound of the application is a common sound such as a sound used when selecting a menu item in a pulldown menu, a copy of the original sound (e.g., as embodied in a file) can be stored in memory. The copy is a muted version of the original sound. The copy would be played in step 1755. As also described above, applications typically use only a few sounds. The SMF 1610, upon initially muting an application 1601, could make a copy (e.g., by copying a file) of a sound requested to be played by the application. The copy would be stored with data at a muted level and the next time the muted application requests to play the sound, the copy would be played, thereby muting the application. The copy (e.g., or a reference to the copy) is then used in step 1745 when passed to the operating system 1635.

After an action is taken in step 1780, the method 1700 continues in step 1720. Thus, method 1700 shows examples of actions taken so that sounds requested to be played by a muted application are muted with respect to a sound device.

Generally, various exemplary embodiments of the invention can be implemented in different mediums, such as software, hardware, logic, special purpose circuits or any combination thereof. As a non-limiting example, some aspects may be implemented in software which may be run on a processing unit, while other aspects may be implemented in hardware.

The foregoing description has provided by way of exemplary and non-limiting examples a full and informative description for carrying out exemplary embodiments. However, various modifications and adaptations may become apparent to those skilled in the relevant arts in view of the foregoing description, when read in conjunction with the accompanying drawings and the appended claims. All such and similar modifications of the teachings of this invention will still fall within the scope of this invention.

Furthermore, some of the features of the exemplary embodiments of this invention could be used to advantage without the corresponding use of other features. As such, the foregoing description should be considered as merely illustrative of the principles of the present invention, and not in limitation thereof.

What is claimed is:

1. A computer-readable medium tangibly embodying program instructions, execution of the program instructions by at least one processor resulting in operations comprising:

allowing a user to selectively mute up to n-1 applications of n computer-executed applications, where n is an integer greater than 1; and in response to the user choosing to selectively mute up to n-1 applications, performing at least one action in response to requests by the selectively muted applications to play sounds so that the sounds are muted with respect to a sound device, wherein a respective one of the requests from a corresponding one of the applications references data corresponding to the sound for the corresponding one of the applications, wherein the operation of performing at least one action further comprises operations of muting the data prior to coupling the data to the sound device and coupling the muted data to the sound device, wherein the operation of coupling the muted data to the sound device further comprises the operation of passing a function call, including a reference to the muted data, to an operating system.

2. The computer-readable medium of claim 1, wherein the operation of performing at least one action further comprises an operation of muting for a respective one of the requests from a corresponding one of the applications at least one multimedia device coupled to the corresponding application and to the sound device.

3. The computer-readable medium of claim 1, wherein the operation of performing at least one action further comprises an operation of rejecting a respective one of the requests from a corresponding one of the applications.

4. The computer-readable medium of claim 1, wherein for a respective one of the requests from a corresponding one of the applications, the operation of performing at least one action further comprises the operations of responding to the corresponding application for any response associated with the respective request.

5. The computer-readable medium of claim 1, wherein the operation of muting the data further comprises an operation of performing one of zeroing data corresponding to the sound or decreasing to a predetermined value a level of the data.

6. The computer-readable medium of claim 1, wherein a respective one of the requests from a corresponding one of the applications references first data corresponding to the sound, and wherein the operation of performing at least one action further comprises an operation of coupling second data to the sound device, the second data comprising a muted version of the first data.

7. The computer-readable medium of claim 6, further comprising creating the second data through an operation of performing one of zeroing the first data to create the second data or decreasing to a predetermined value a level of the first data to create the second data.

8. The computer-readable medium of claim 6, wherein the operation of coupling the second data to the sound device further comprises an operation of passing a function call, including a reference to the second data, to an operating system.

9. The computer-readable medium of claim 6, wherein the muted version of the first data includes one of first data that has been zeroed or first data that has had a level of the first data decreased to a predetermined value.

10. The computer-readable medium of claim 1, wherein a respective one of the requests comprises a request to play a sound stored at least partially in at least one file.

11. The computer-readable medium of claim 1, wherein the operation of performing at least one action further comprises an operation of performing one of zeroing data corresponding to the sound or decreasing to a predetermined value a level of the data.

12. The computer-readable medium of claim 11, wherein the operation of decreasing to a predetermined value a level of the data further comprises the operation of mapping each first value for samples of the data to a second value, wherein a range of the second values is less than a range of the first values.

13. The computer-readable medium of claim 1, wherein data corresponding to the sound is stored in a file, and wherein the operation of performing at least one action further comprises retrieving the data from the first file, muting the data, and storing the data in a second file.

14. A method, comprising:
allowing a user to selectively mute up to n-1 applications of n computer-executed applications, where n is an integer greater than 1; and
in response to the user choosing to selectively mute up to n-1 applications, performing at least one action in response to requests by the selectively muted applications to play sounds so that the sounds are muted with respect to a sound device,
wherein a respective one of the requests from a corresponding one of the applications references data corresponding to the sound for the corresponding one of the applications, wherein performing at least one action comprises muting the data prior to coupling the data to the sound device and coupling the muted data to the sound device,
wherein coupling the muted data to the sound device further comprises passing a function call, including a reference to the muted data, to an operating system.

15. The method of claim 14, wherein performing at least one action comprises muting for a respective one of the requests from a corresponding one of the applications at least one multimedia device coupled to the corresponding application and to the sound device.

16. The method of claim 14, wherein performing at least one action comprises rejecting a respective one of the requests from a corresponding one of the applications.

17. The method of claim 14, wherein for a respective one of the requests from a corresponding one of the applications, performing at least one action comprises responding to the corresponding application for any response associated with the respective request.

18. The method of claim 14, wherein a respective one of the requests from a corresponding one of the applications references first data corresponding to the sound, and wherein performing at least one action comprises coupling second data to the sound device, the second data comprising a muted version of the first data.

19. The method of claim 14, wherein a respective one of the requests comprises a request to play a sound stored at least partially in at least one file.

20. The method of claim 14, wherein performing at least one action performs one of zeroing data corresponding to the sound or decreasing to a predetermined value a level of the data.

* * * * *